US005524149A

United States Patent [19]
Frenzel

[11] Patent Number: 5,524,149
[45] Date of Patent: Jun. 4, 1996

[54] CIRCUIT ARRANGEMENT FOR ECHO SUPPRESSION

[75] Inventor: Rudi Frenzel, Weinheim, Germany

[73] Assignee: U.S. Philips Corporation, New York, N.Y.

[21] Appl. No.: 293,636

[22] Filed: Aug. 18, 1994

[30] Foreign Application Priority Data

Aug. 21, 1993 [DE] Germany .................. 43 28 139.7

[51] Int. Cl.⁶ ................................................ H04M 9/08
[52] U.S. Cl. .................. 379/379; 379/410; 379/411; 379/406; 379/407; 364/724.18; 364/724.19
[58] Field of Search .................... 379/410, 406, 379/411, 402, 407; 364/724.18, 724.19

[56] References Cited

U.S. PATENT DOCUMENTS 4,903,247  2/1990  Van Gerwen et al. ............ 379/411
5,278,900  1/1994  Van Gerwen et al. ............ 379/411

FOREIGN PATENT DOCUMENTS 0301627  2/1989  European Pat. Off. .

OTHER PUBLICATIONS

"General Characteristics Of International Telephone Connections And International Telephone Circuits" CCITT Recommendation G. 167 (Mar. 1993).
"Multidelay Bkock Frequency Domain Adaptive Filter" Jia Sien Soo et al, IEEE Transactions On Acoustics, Speech, And Signal Processing, vol. 38, No. 2, Feb. 1990.

Primary Examiner—Jeffery Hofsass
Assistant Examiner—Jacques M. Saint-Surin
Attorney, Agent, or Firm—David Schreiber

[57] ABSTRACT

In an adaptive filter a frequency domain filter is used to enhance the convergence properties of the filter for strongly correlated signals.

To reduce the amount of delay in the filter the impulse response of said filter for small values of time is generated by a time domain filter, and said impulse response for larger values of time is generated by a frequency domain filter.

5 Claims, 4 Drawing Sheets

CIRCUIT ARRANGEMENT FOR ECHO SUPPRESSION

BACKGROUND OF THE INVENTION

The invention relates to a digital filter arrangement for producing a sequence of digital filter signals from a sequence of digital input signals fed to a filter input, with the aid of a number N of filter coefficients. Such filters can be implemented as time-domain filters or as frequency-domain filters. Problems can occur in the case of these different implementations, which problems are intended to be explained in more detail in the following text using the example of an arrangement for echo suppression for a loudspeaker telephone installation. Such an arrangement contains a receiving path for received signals, a signal connection for reception of an input signal which is formed by superimposition of a locally produced signal and a changed received signal, a first digital filter of order N for producing the correction signals from received signals, a superimposition arrangement for reception of the input signal and of the correction signals and for emitting a transmit signal, and a computation arrangement having a first frequency-domain filter for repeated adaptive production of coefficients for the first digital filter from an auxiliary signal, which corresponds to the transmit signal, and is disclosed in EP 0 301 627 A1. FIG. 1 illustrates the basic structure for use in a loudspeaker telephone installation. The signals, generally voice signals, are received by the opposite station via a receiving path 1 and are reproduced via a loudspeaker 7. A microphone 8 picks up the reproduced received signal via an echo path 9, together with a local signal 10, especially from a loudspeaker. In the case of typical environmental conditions in loudspeaker telephone installations, the echo path 9 can be modelled to a very good approximation as a linear dynamic transmission system (filter) and it varies the reproduced received signal both in terms of frequency response and in its position in time, that is to say it is delayed, and a plurality of differently delayed received signals, with differently changed frequency spectra, generally arrive superimposed at the microphone 8. The input signal produced by the microphone 8 is fed to an input 3 of the circuit arrangement and is passed via a superimposition arrangement 6 to a transmit output 5, from where it is transmitted to the opposite end. Echo components in the transmit signal generally have an interfering effect at the opposite end. The signal comprehensibility can be considerably adversely affected, depending on the intensity of the echoes and the delay time between the end points of the link. Furthermore, particularly in the field of two-wire/four-wire junctions in the telephone network, it is possible for part of the transmit signal at the output 5 also to be fed to the receiving path 1 so that a closed loop is formed via the echo path 9, which can tend to produce feedback oscillations. It is thus necessary to suppress as much as possible from the input signal at the input 3 that component coming via the echo path 9, before the input signal is emitted via the output 5.

This is done with the aid of a linear, dynamic filter 2 which produces a signal from the received signal on the receiving path 1, which signal largely corresponds to the echo signal arriving at the microphone 8 via the echo path 9, and this echo signal is subtracted from the input signal, in the superimposition arrangement 6, so that only the signal 10 of the local loudspeaker still essentially appears at the output 5. Since the properties of the echo path 9, however, depend largely on the local conditions and can vary even in the short term, the filter 2 cannot be rigidly set, but its coefficients must be continuously matched to the instantaneous echo signal. This is done with the aid of a computation arrangement 4, in accordance with known algorithms. In this case, the computation arrangement 4 as well as the filter 2 normally operate using time-discrete digital signal values, while the received signal on the receiving path 1 and the input signal at the input 3 are normally analog. The analog/digital converters and digital/analog converters required in this case are not illustrated in any greater detail in FIG. 1 or in the following figures either.

The algorithm, which is used in the computation arrangement 4, for adaptively determining the filter coefficients is intended, on the one hand, to require as little computation complexity as possible and, on the other hand, to converge as quickly as possible. A favourable compromise between the two requirements, which can typically be satisfied simultaneously only with difficulty, is offered by the use of block frequency-domain algorithms. This means that the coefficients of the filter 2 are also produced in the frequency domain so that a frequency-domain filter is suitable for this filter. However, this has the disadvantage that the serial data flow between the input 3 and the superimposition arrangement 6 must be converted into data blocks for processing using the output values from the frequency-domain filter. The block formation is linked with a signal delay which is equal to the time period for sampling the non-overlapping signal values of two successive data blocks. This relationship becomes clearer in the further description. Such a delay of the transmit signal is, however, unacceptable, particularly for loudspeaker telephone installations (see also CCITT Recommendation G. 167).

In the abovementioned EP 0 301 627 A1, a time-domain filter which operates without any delay is therefore used for the filter 2. However, this time-domain filter has a high computation requirement and, in addition, it is necessary to take into account the fact that the time-domain filter replaces the frequency-domain filter only with respect to the calculation of the first correction signal, while it is also required within the computation arrangement 4 for calculating the auxiliary signal. The latter is used for calculations relating to continuous adaptation of the filter coefficients. As becomes clear from FIG. 2, which reproduces in simplified form a structure illustrated in the said document, the complexity for a system with an additional time-domain filter rises in comparison with a pure block frequency-domain filter, essentially by the complexity for the additional time-domain filter.

In the arrangement according to FIG. 2, a block of successive digital received signals is converted into parallel form in a transformation arrangement 44 and is subjected to block-by-block orthogonal transformation, for which purpose a fast Fourier transformation (FFT) is expediently used, in order to transform the block of successive received signals into the frequency domain. The signal blocks comprise B values, it being necessary for successive blocks to overlap by at least N−1 values. The number L of new, non-overlapping values per block determines the time period which is required for collecting a block. Block frequency-domain algorithms, which satisfy these requirements, are designated as an "overlap save" method. Implementations which are favourable in terms of complexity are achieved using the B=2N, L=N.

The signals in the frequency domain occurring at the output 45 are fed to a computation arrangement 40 and to a frequency-domain filter 42. This produces at the output 43 a block of filtered signals in the frequency domain which are subjected via a further transformation arrangement 46 to inverse orthogonal transformation, that is to say in this case to inverse fast Fourier transformation (IFFT). The transformation arrangement 46 emits the signals, which have been transformed in the time domain, block-by-block to a second superimposition arrangement 48 which receives at a second input the input signals from the input 3, to be precise via an arrangement 47 which converts the serial data flow of the input signals at the input 3 into a parallel form, that is to say into data blocks. In this case, the same rules (overlapping) must be satisfied as in the case of block formation before the transformation device. The signals which occur at the output of the transformation arrangement 46 and thus, in the adapted case, correspond to the delayed echo signals of the echo path are subtracted from the signals at the output of the arrangement 47, so that an echo-suppressed signal is produced on the output line 49 of the second superimposition arrangement 48, which signal largely corresponds to the transmit signal at the output 5, but is shifted in time with respect to it. This auxiliary signal of the line 49 is fed to the computation arrangement 40 in order continuously to adapt the filter coefficients on the link 41.

These filter coefficients are additionally fed to a transformation arrangement 22 in which these filter coefficients are converted into time-domain coefficients with the aid of orthogonal transformation, which corresponds to that in the transformation arrangement 46, the time-domain coefficients being fed via the link 23 to the time-domain filter 2. In addition, these coefficients are buffer-stored on the link 23, as is described in the abovementioned document, although this is not important in this context. The filtered signals which are produced without any delay by the filter 2 with the aid of these coefficients are fed to the first superimposition arrangement 6 and there subtracted from the input signals obtained at the input 3, in order to produce the transmit signal which is emitted at the output 5. From application-oriented view points, the calculation in the transformation arrangement 22 and the preparation of the newly adapted coefficients can be delayed on the link 23 in order to achieve a favourable time breakdown of the individual computation steps of the algorithm.

As already mentioned, a time-domain filter requires high computation complexity. In the case of a filter of order N having N coefficients, N multiplications and N additions occur for each correction signal. Thus, for example, at a sampling frequency of 8 kHz for digitizing and with N=2048 filter coefficients, approximately 16.4 million additions and multiplications are required per second. This is virtually impossible to carry out using a conventional signal processor, as is generally used for implementing a filter, so that a plurality of processors must be used for this purpose.

A partitioned block frequency-domain filter which can be used for echo suppression arrangements in telephone installations is described under the title "Multi Delay Block Frequency Domain Adaptive Filter" in the journal "IEEE Trans. on ASSP", Vol. 38, No. 2, 1990, pp 373–376. FIG. 3 shows the structure of the method. In contrast to the closed frequency-domain algorithm, in the case of the partitioned method, the N filter coefficients w(i) are not defined in a block but in K partitions of size M=N/K. The time-domain coefficients w(0) ... w(M–1), w(M) ... w(2M–1) to w(K–1)M ... w(KM–1) are present on the links $23_0$ to $23_{K-1}$. The first correction signal $\hat{y}$ (n) is determined using the filter 2, by means of the convolution operation.

$$\hat{y}(n) = \sum_{p=0}^{k-1} \sum_{i=0}^{M-1} x(n-pM-i)w(pM+i)$$

$$\hat{y}(n) = \sum_{i=0}^{N-1} x(n-i)w(i)$$

The frequency-domain coefficients are calculated on a partition basis in "adaptation arrangements" which are in each case composed of a computation arrangement $40_0$ to $40_{K-1}$ and of a frequency-domain filter $42_0$ to $42_{K-1}$. These are fed with data blocks on the input side via the link $45_0$ to $45_{K-1}$, which data blocks are smaller by a factor K than those in the closed adaptation method. The input data of adjacent adaptation arrangements are in each case delayed by one block duration with respect to one another, by delay units 38. This corresponds to a time period of M input signals. The first adaptation arrangement is fed from a transformation arrangement 44 which, on the input side, combines B=2M input signals to form an input data block. Each input data block overlaps the preceding block by M input signals. The output signals of the K frequency-domain filter partitions $42_0$ to $42_{K-1}$ are added in a summing unit 35 and are fed to a transformation unit 46. A second correction signal is available at the output of this transformation unit, which second correction signal corresponds essentially to a delayed version of the first correction signal. In a second superimposition arrangement 48, an auxiliary signal for adaptation of the frequency-domain coefficients is calculated from the second correction signal and in each case a number M of input data items from the input 3, which items are combined by the arrangement 47 to form a data block, and this auxiliary signal is fed via the link 49 to all the computation arrangements $40_0$ to $40_{K-1}$.

SUMMARY OF THE INVENTION

The object of the invention is to specify a digital filter arrangement of the type mentioned initially which operates without any dead time, that is to say without any delay, and requires less complexity, and is thus particularly favourable for arrangements for echo suppression.

This object is achieved according to the invention in that the filter comprises a time-domain filter of order M·p, for producing first filter element signals using the first M·p coefficients, and a frequency-domain filter of order M(K–p), for producing second filter element signals using the following M(k–p) coefficients, where M=N/K, K=2,3,4 ... and p=1,2 ... <K, the sum of the first and the second filter element signals representing the filter signal.

The invention uses essentially the described partitioned block frequency-domain algorithm for adaptation of the filter coefficients and is based on splitting the filter into a time-domain filter of order M·p for producing first filter element signals using the first M·p coefficients, that is to say the coefficients of the first p partitions, and into a frequency-domain filter of order M(K–p) for producing second filter element signals using the frequency-domain coefficients of the partitions p to K–1. Each sum of a first and a second filter element signal represents a complete filter signal, that is to say, in the case of an application for an arrangement for echo suppression, a first correction signal for the first superimposition arrangement:

$$\hat{y}(n) = \hat{y}_I(n) + \hat{y}_{II}(n) \qquad (1)$$

where

-continued $$\hat{y}_I(n) = \sum_{i=0}^{p+M-1} x(n-i)w(i) \quad (2)$$

and $$\hat{y}_{II}(n) = \sum_{i=p+M}^{N-1} x(n-i)w(i) \quad (3)$$

The first component in accordance with equation (2) is determined by the time-domain filter without any delay, the complexity for the time-domain filter, that is to say the number of computation steps for a correction signal, being less by the factor K/p than if the complete filter were used as a time-domain filter. If the coefficients of the complete filter are in the frequency domain, then, in addition, only the first M·p coefficients, that is to say the first p partitions, need be transformed into the time domain, to be precise once for in each case M·p input signals. The second component according to (3) can, in contrast, be determined in the frequency-domain filter since, for this component, only delayed input signals of the sequence are used which are delayed by at least M·p input signals. The possibility of determining the second component using a frequency-domain filter is provided if $p \geq 1$ and $K > 1$, it being necessary to take into account for p=1 the fact that, during the time interval between the last sampling signal of one block and the first input signal of the subsequent block, all the processing of this block of input signals would have to be carried out in the frequency-domain filter, including the preceding and subsequent transformation, while no processing activities would be carried out in the frequency-domain filter in the remaining time.

A more expedient refinement of the invention is based, in contrast, on the idea that a time interval corresponding to a large number of input signals should be made available for the processing time of a block of input signals in the frequency-domain filter, for example a time interval corresponding to a block of input signals, while the input signals for the next block are received in parallel. The order of the time-domain filter should be as low as possible, that is to say the value for M·p should be small, since the time-domain filter requires a particularly large number of computation steps. On the other hand, the ratio of the computation complexity to the available computation time rises with the number of partitions K (small M), so that K cannot be increased without restriction. Taking into account these viewpoints, one refinement of the invention is characterized in that $K \geq 4$ and p=2, and the frequency-domain filter is constructed with K−2 partitions for block-by-block processing of in each case M signals. A block of M new input signals for the frequency-domain filter can thus be collected during the time duration of this block by selection of the value p=2, and can be converted into parallel form, and the processing in the second frequency-domain filter, including the transformation from the frequency domain into the time domain on the output side, can be carried out during the time duration of the following block and, thus, the second filter element signals can be emitted with a delay time of 2×M sampling cycles. The condition contained in equation (3) for the delay time is thus satisfied.

The invention furthermore relates to a circuit arrangement for echo suppression, having a filter according to the invention which is connected between an input path for input signals and one input of a superimposition arrangement, another input of which is set up for reception of a signal which is formed by superimposition of a locally produced signal, and having a computation arrangement, and of a second filter for repeated adaptive production of coefficients for the first filter. A circuit arrangement for echo suppression having very favourable properties is obtained by the use of the filter according to the invention.

For adaptive production of the coefficients for the filters, the computation arrangement requires an auxiliary signal which is formed by subtraction of a second correction signal from the delayed input signal.

As is shown in FIG. 3, the second correction signal, which is required for calculation of the auxiliary signal, is produced by the first partitioned frequency-domain filter ($42_0$, $42_1$, ..., $42_k$). According to a further refinement of the invention, it is thus particularly expedient that the first partition comprises a transformation arrangement (44), which is common to both frequency-domain filters, for carrying out an orthogonal transformation of a block of input signals, and the following partitions comprise in each case one memory arrangement ($38_1$, ..., $38_{k-1}$), which is common to both frequency-domain filters, for storing a block of transformed signals emitted from the transformation arrangement or from the memory arrangement of the preceding partition. In this way, no special memory arrangements are required for the first frequency-domain filter and, in addition, no special transformation arrangement is required on the input side. This results in a cost-effective construction since the multiplications and additions which are to be carried out in the filters and in the computation arrangement are carried out, in the same way as the transformations, generally by means of signal processors so that essentially only memories are also additionally required.

BRIEF DESCRIPTION OF THE DRAWINGS

Exemplary embodiments of the invention are explained below with reference to the further figures, in which.

DETAILED DESCRIPTION OF THE PREFERRED EMBODIMENTS

Figure 1:
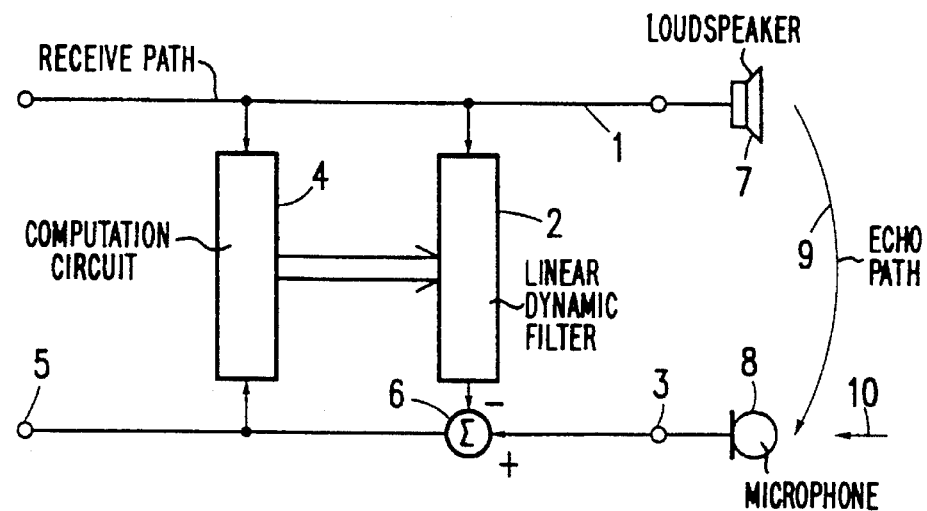
FIG. 1 shows a block diagram which illustrates the basic structure for use in a loudspeaker telephone installation in accordance to the prior art.
Figure 2:
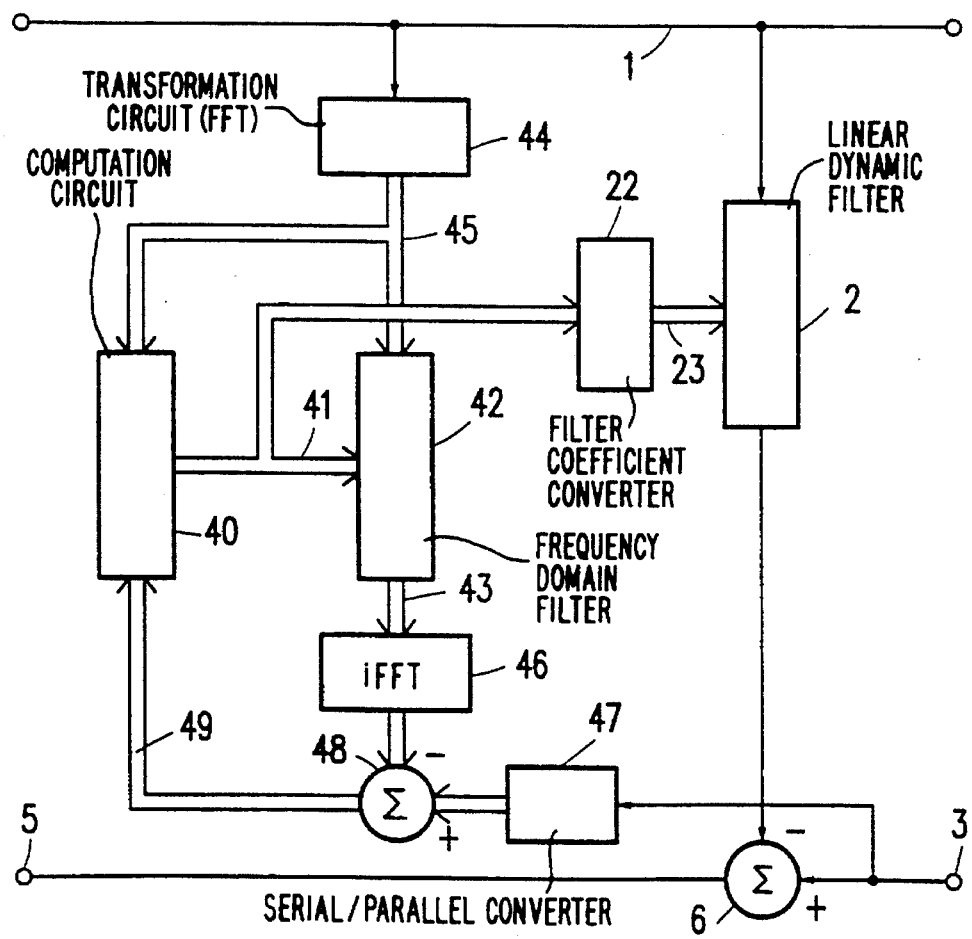
FIG. 2 shows a further embodiment in accordance to the prior art.
Figure 3:
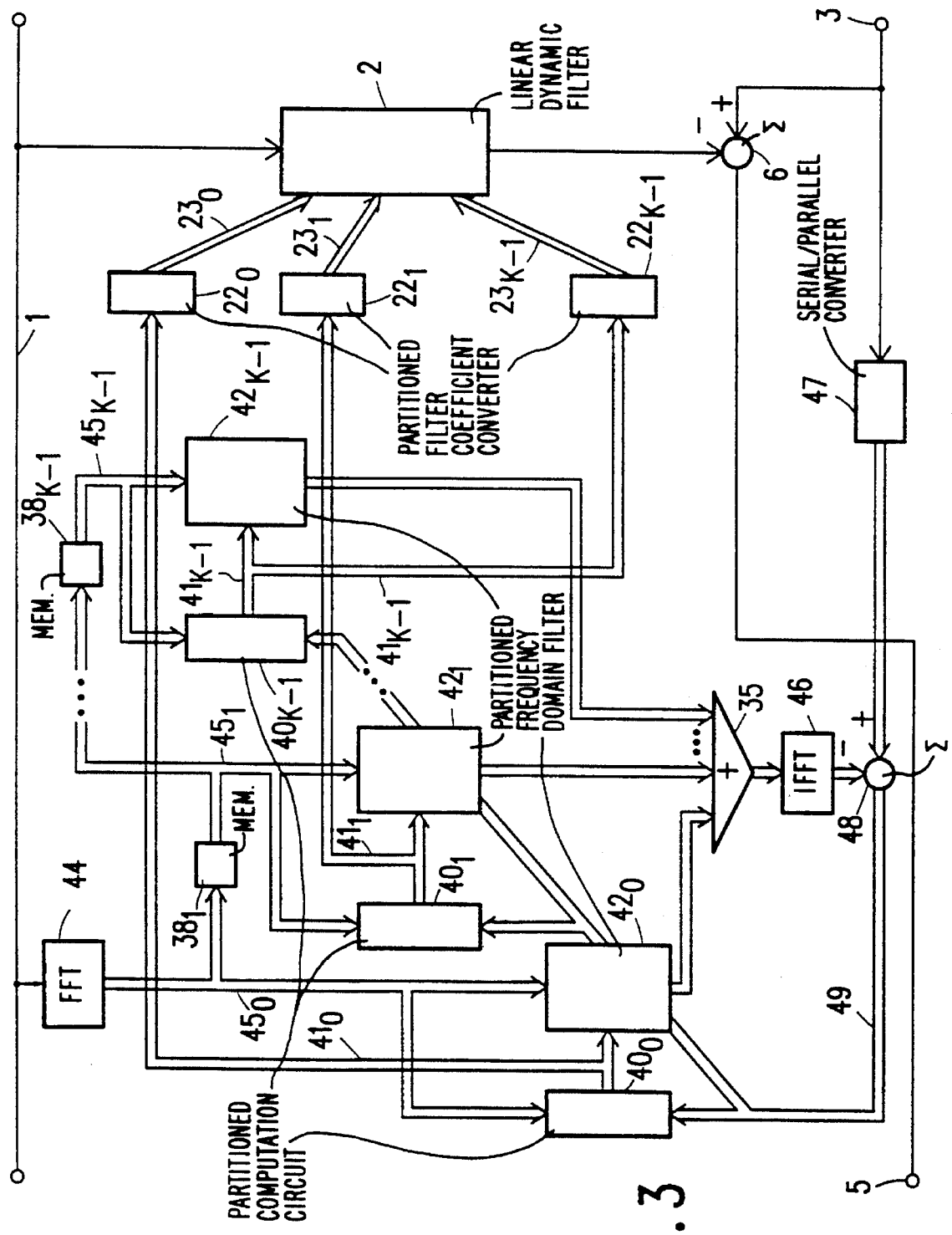
FIG. 3 shows the structure of the method in accordance to the prior art.

In these figures, elements which are of identical construction or have the same function as corresponding elements in FIGS. 1 to 3 are designated by the same reference symbols.

Figure 4:
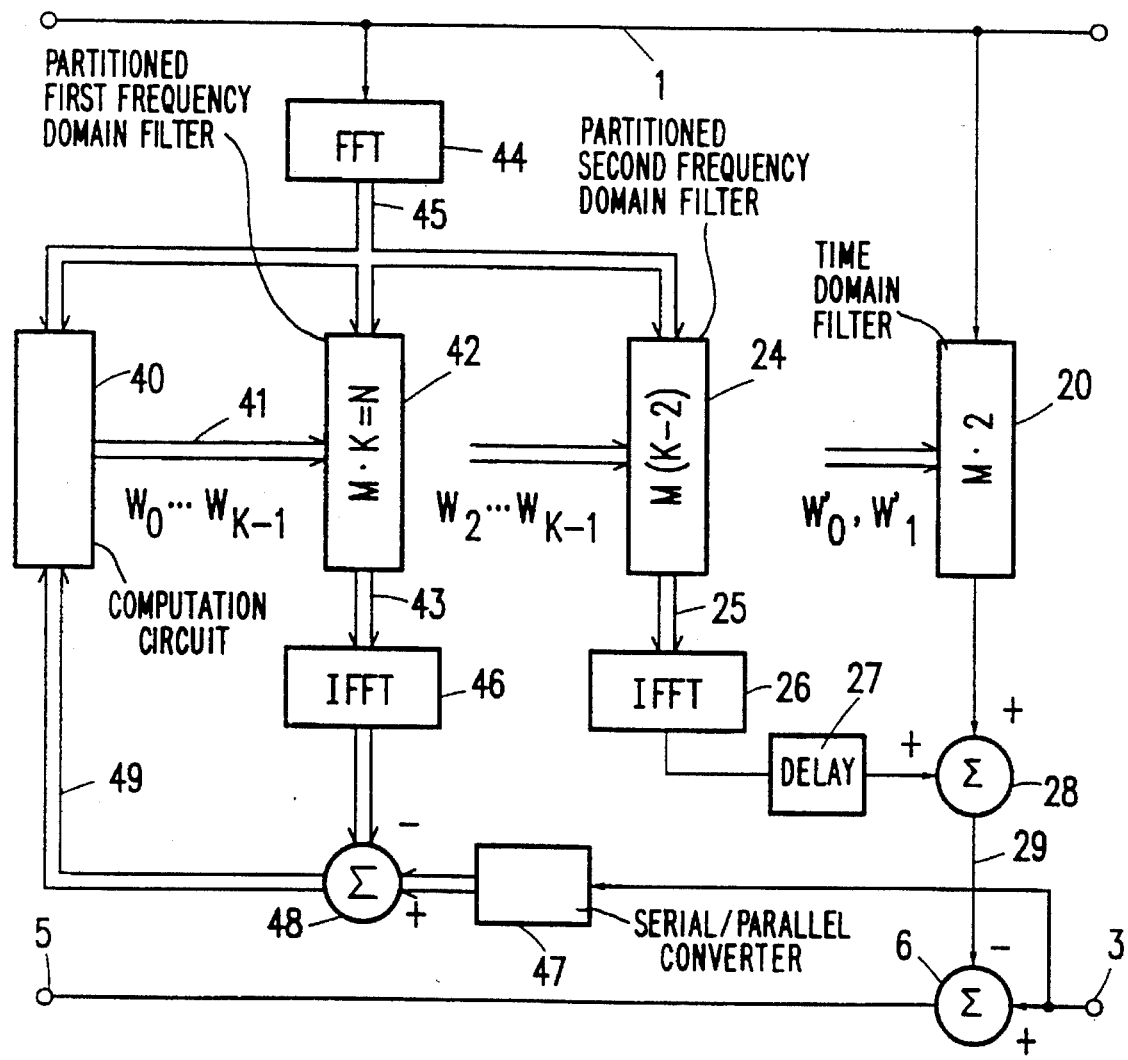
FIG. 4 shows the block diagram of an arrangement according to the invention for p=2.

In FIG. 4, a transformation arrangement 44 is connected to the receiving path 1, which transformation arrangement 44 converts a block of 2M received signals (M new values and M overlapping values) into a parallel form, and converts this block of received signals into the frequency domain by means of a fast Fourier transformation FFT. The fast Fourier transformation should be understood here as being only an example, and a different, known orthogonal transformation can also be used. The block of transformed data produced at the output 45 is fed to a computation arrangement $40_0$ to $40_{K-1}$ and to a first frequency-domain filter 42 and a second frequency-domain filter 24. For clarity, the computation arrangement and the first filter arrangement, which actually consist of a plurality of partitions corresponding to the computation arrangements $40_0$ to $40_{K-1}$ and to the filters $42_0$ to $42_{K-1}$ in FIG. 3, are each illustrated in simplified form only as a single unit. In accordance with one of the known algorithms, the computation arrangement 40 produces at the output 41 coefficients, to be precise K blocks $W_0$ to $W_{K-1}$, each having M coefficients.

All the blocks of coefficients are fed to the first frequency-domain filter 42 of order M×K=N. At the output 43, which corresponds to the output of the summing unit 35 in FIG. 3, this filter produces a block of M second correction signals which are fed to an inverse Fourier transformation arrangement 46. This produces from them a block of transformed second correction signals in the time domain, and emits these second correction signals, in parallel form, to the subtracting input of a superimposition arrangement 48. At the adding input, and via an arrangement for forming parallel data blocks from a serial data flow 47, this superimposition arrangement 48 receives the input signal fed to the input 3 and produces on the line 49 an auxiliary signal which is used in the computation arrangement 40 for adaptive production of the coefficients. To this extent, this corresponds to the construction illustrated in FIG. 3.

The received signals on the receiving path 1 are additionally fed to a time-domain filter 20 which obtains the first two blocks $W_0$ and $W_1$ of coefficients, to be precise the blocks $W'_0$, $W'_1$ of coefficients transformed into the time domain, from those coefficients which are produced by the computation arrangement at the output 41, the associated transformation arrangements not being illustrated here, for the sake of clarity. This time-domain filter 20 thus produces an undelayed current of first partial correction signals, which are fed to one input of a summing arrangement 28.

The second frequency-domain filter 24, of order M(K−2), receives the blocks $W_2$ to $W_{K-1}$ of coefficients produced by the computation arrangement 40 and emits at the output 25 second partial correction signals in the frequency domain, which are converted by means of the transformation arrangement 26, likewise for carrying out an inverse fast Fourier transformation, into a block of second partial correction signals in the time domain, and are emitted to the second input of the summing arrangement 28, successively in time, via a delay unit 27 which produces a delay corresponding to M sampling intervals. This summing arrangement 28 produces at the output 29 a sequence of first correction signals which are fed to the subtracting input of a superimposition arrangement 6 which, at the adding input, receives the input signals from the input 3 and produces at the output the transmit signal with suppressed echo signal, and feeds this to the output connection 5.

Thus, in this arrangement the time-domain filter 20 produces the signal component specified in the equation (2) mentioned initially if p=2 is set, while the second frequency-domain filter 24, in conjunction with the transformation unit 26 and the delay arrangement 27, produces the signal component in accordance with equation (3). The complete signal in accordance with equation (1) is thus produced at the output 29 of the summing arrangement 28.

Figure 5:
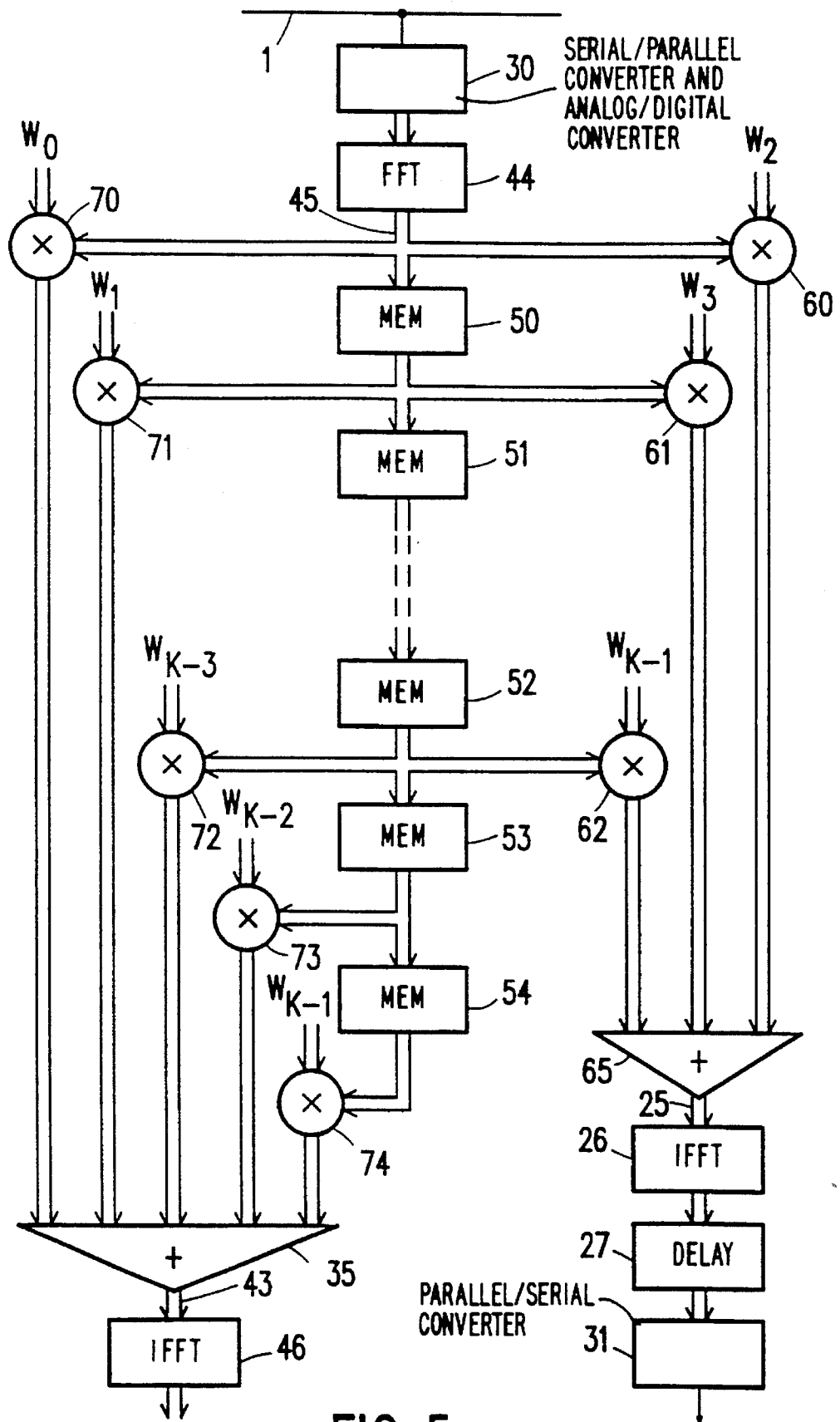
FIG. 5 shows schematically the construction of the first and second frequency-domain filters with common elements.

The two frequency-domain filters 24 and 42 consist of a number of partitions, as is indicated in FIG. 5. A block of input data is processed in each partition, to be precise essentially by multiplication by an associated block of coefficients and summation of the products. The multiplications to be carried out in the filter 24 are indicated in FIG. 4 symbolically by multipliers 60, 61 and 62, while the multiplications in the filter partitions 42 are indicated by the multipliers 70 to 74. The summations are indicated by adders 65 and 35. The data which are processed in each partition are contained in memories 50 to 54. These memories are common to both filters.

The data to be processed in each partition are formed by a block of input data, said data being transformed block-by-block in the transformation arrangement 44 from the time domain into the frequency domain. To this end, the input data must be provided in parallel form, which is achieved by the arrangement 30. In said arrangement, the received signal which is present on the receiving path 1 is sampled periodically and converted into a sequence of digital values, and in each case one block of digital data is collected and transferred to the transformation arrangement 44. The collection of the input data for the subsequent block is in each case started immediately after the end of a block of input data.

During this time, the preceding block of data is transformed in the transformation arrangement 44, and the previously existing transformed data are transferred into the memory 50, whose earlier data are transferred into the memory 51 etc, while the preceding data in the memory 54 are merely overwritten and are thus deleted.

As soon as the transformation arrangement 44 has carried out a transformation and emitted the transformed data at the output 45, and the data in all the memories 50 to 54 have been displaced by one memory, the carrying out of the multiplications is started. In this case, the data emitted at the output 45 of the transformation arrangement 44 are multiplied, for implementation of the filter 24 in FIG. 3 in the multiplier 60, by the block $W_2$ of coefficients, while, in order to implement the filter 42 in FIG. 3, the same data are multiplied in the multiplier 70 by the block $W_0$ of coefficients. The data present at the output of the memory 50 are correspondingly multiplied, for the filter 24 in the multiplier 61, by the block $W_3$ of coefficients, while, for the filter 42, these data are multiplied in the multiplier 71 by the block $W_1$ of coefficients. This applies in a corresponding manner to the following memories until the third from last memory 52 whose data are multiplied in the multiplier 62 by the block $W_{K-1}$ and are multiplied in the multiplier 72 by the block $W_{K-3}$. Since the filter 42 has the entire length of K partitions, while the filter 24 has only (K−2) partitions, the last two memories 53 and 54 lead only to the multipliers 73 and 74 where they are multiplied by the blocks $W_{K-2}$ and $W_{K-1}$, respectively, of coefficients. The products produced are added in the adders 65 and 35 respectively, and are emitted via the output 25 or 43 respectively.

The outputs 25 and 43, which each emit one block of filtered data, now lead to separate transformation arrangements 26 and 46, respectively, for carrying out a transformation with these data, which transformation is inverse with respect to the transformation in the transformation arrangement 44. The data block at the output of the transformation unit 46 is passed on directly to the superimposition arrangement 48 in FIG. 4, while the output data of the transformation unit 26 are passed via the delay arrangement 27 to a conversion stage 31, which converts the data into a serial flow which is passed to the summing arrangement 28 in FIG. 4.

The processing activities for one block of data in the transformation arrangement 44, the multipliers 60 to 62 and 70 to 74 respectively and the transformation arrangements 26 and 46 can be carried out within the time interval in which one data block is collected in the arrangement 30.

Since the arrangement 30 produces a delay by one block, the signals occurring at the output of the arrangement 31 belong to received signals on the receiving path 1, which lag by two blocks, that is to say the arrangement illustrated in FIG. 4 of the filters 24 and 42 has a delay time of two blocks. In this case, the delay arrangement 27 is omitted, since the delay is achieved by the described time sequence of data collection (block formation) and data processing. Thus, as already mentioned, the time-domain filter 20 in FIG. 3 need have a length of only two blocks.

What is claimed is:

1. A digital filter arrangement for producing a sequence of digital filter signals from a sequence of digital input signals fed to an input utilizing a number N of filter coefficients, comprising:

a time-domain filter of order L, for producing first filter element signals using the first L coefficients;

a frequency-domain filter of order N–L, for producing second filter element signals; and addition means for determining the filter signal from the sum of the first and second filter element signals.

2. The filter arrangement as claimed in claim 1, characterized in that L=M×p and N–L =M(K–p), in that with M=N/K, in that K is an integer greater than 1, and in that p is an integer greater than or equal to 1 and less than K.

3. Filter arrangement according to claim 2, characterized in that K≧4 and p=2 and the frequency-domain filter is formed from (K–2) partitions for block-by-block processing of in each case M signals.

4. Circuit arrangement for echo suppression having a first filter according to claim 1 which is connected between a receiving path for received signals and one input of a superimposition arrangement, another input of which is set up for reception of a signal which is formed by superimposition of a locally produced signal and a changed received signal, and having a computation arrangement, and of a second filter for repeated adaptive production of coefficients for the first filter.

5. Circuit arrangement according to claim 3, the second filter being a further frequency-domain filter, and this further frequency-domain filter together with the frequency-domain filter of the first filter being formed by partitions for block-by-block processing of in each case M signals, characterized in that the first partition comprises a transformation arrangement, which is common to both frequency-domain filters, for carrying out an orthogonal transformation of a block of input signals, and the following partitions comprise in each case one memory arrangement, which is common to both frequency-domain filters, for storing a block of transformed signals emitted from the transformation arrangement or from the memory arrangement of the preceding partition.

\* \* \* \* \*